(12) United States Patent
Filippo et al.

(10) Patent No.: US 6,577,171 B1
(45) Date of Patent: Jun. 10, 2003

(54) METHODS AND APPARATUS FOR PREVENTING INADVERTENT ACTIVATION OF POWER DEVICES

(75) Inventors: Roberto Filippo, Barge (IT); Aldo Novelli, S. Lorenzo Parabiago (IT); Roberto Gariboldi, Lacchiarella (IT); Angelo Genova, Delia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/721,100

(22) Filed: Nov. 22, 2000

(30) Foreign Application Priority Data

Nov. 25, 1999 (IT) .......................................... MI99A2469

(51) Int. Cl.$^7$ ................................................. H03K 3/00
(52) U.S. Cl. ......................... 327/108; 327/376; 327/436
(58) Field of Search .......................... 327/108–112, 374, 327/375, 376, 434, 436, 437, 544

(56) References Cited

U.S. PATENT DOCUMENTS 6,072,729 A * 6/2000 Casper ........................ 327/108
6,075,391 A * 6/2000 Tarantola et al. ............ 327/111
6,087,862 A * 7/2000 Williams ..................... 327/108
6,204,700 B1 * 3/2001 Seyed ......................... 327/108

* cited by examiner

Primary Examiner—Kenneth B. Wells
(74) Attorney, Agent, or Firm—Wolf, Greenfield & Sacks, P.C.; James H. Morris

(57) ABSTRACT

A high side circuit includes at least one power device having a first non-drivable terminal connected to a supply voltage, at least one load connected between a second non-drivable terminal of the power device and ground, and driving circuitry. The driving circuitry includes transistors which are connected to each other and to a higher voltage than the supply voltage in order to control the turning on and the turning off of the power device and to reduce or minimize the potential difference between the second non-drivable terminal and a drivable terminal of the power device during the turning off state to avoid the re-turning on of the same power device.

22 Claims, 3 Drawing Sheets

METHODS AND APPARATUS FOR PREVENTING INADVERTENT ACTIVATION OF POWER DEVICES

BACKGROUND OF THE INVENTION

1. Field of the Invention

The present invention relates to a high efficiency "high side" circuit.

2. Discussion of the Related Art

Different circuit configurations are known wherein a DMOS transistor can work as a switch. One configuration among these configurations is that wherein the drain terminal of the DMOS is connected to high voltages, as the supply voltage, while the source terminal is connected to a load which has the other terminal connected to ground; such circuit configuration is called "high side". This circuit is utilized in numerous appliances as in engine control circuits or regulators, in order to drive different loads, but, particularly, inductive loads.

A typical high side circuit configuration, shown in FIG. 1, includes a DMOS transistor 1 which has the drain D connected to a supply voltage Vcc and the source S connected both to the cathode of a diode D1, and to a terminal of an inductive load 2 including an inductance L and a resistance R. Both the anode of the diode D1 and the other terminal of the inductive load 2 are connected to ground. The gate terminal G of the DMOS transistor 1 is connected both to a terminal of a current generator 1 and to a terminal of a switch S0, which can be formed by a MOS or DMOS transistor and has the other terminal connected to ground. The second terminal of the current generator 1 is connected to a voltage Vboot (produced generally by a charge pump) which is higher than the supply voltage Vcc in order to drive the DMOS 1 in a resistive way.

With the switch S0 open the gate terminal G of the DMOS 1 is connected to the voltage Vboot in order to turn on the transistor 1 allowing the current flow into the load 2. Closing the switch S0 the gate terminal of the DMOS 1 is connected to ground in order to turn off the transistor 1. In this way the inductance L is demagnetized through the diode D1 and the capacitance at the gate G of the DMOS is discharged to ground.

The aforementioned high side circuit has numerous problems.

First, the switch S0 must be dimensioned so as to withstand the voltage Vboot, which is a voltage much higher than the supply voltage Vcc.

With the decrease in the lithography of the technologies to produce DMOS transistors and also with the reduction of the gate oxide thickness, the threshold voltage of the DMOS transistors is notably reduced so that it is actually equal or lower than 1 V. The source terminal S of the DMOS 1 by the current re-circle, with the transistor turned off, can be carried to a negative voltage which can cause the non-desired turning on of the transistor 1 and a non-controlled current peak which can damage the transistor 1 and cause an efficiency loss.

Also, in the aforementioned circuit, it is provided that the charge stored in the gate G is discharged to ground rather that into the load thereby causing a further efficiency loss of the circuit.

In view of the state of the art described, it is an object of the present invention to provide a "high side" circuit which has a higher efficiency than the known circuits and solves at least the aforementioned problems.

SUMMARY OF THE INVENTION

According to the present invention, this and other objects are attained by a high side circuit comprising at least one power device having a first non-drivable terminal connected to a supply voltage, at least one load connected between a second non-drivable terminal of the power device and ground, driving circuitry comprising transistors which are connected to each other and to a higher voltage than said supply voltage in order to control the turning on and the turning off of the power device and to reduce or minimize the potential difference between the second non-drivable terminal and a drivable terminal of the power device during the turning off state to avoid the re-turning on of the same power device.

As a result of the present invention it is possible to form a "high side" circuit which, as a result of a different driving circuitry of the DMOS transistor, assures high efficiency of the high side circuit in any operating state.

BRIEF DESCRIPTION OF THE DRAWINGS

The features and the advantages of the present invention will be made evident by the following detailed description of an embodiment thereof, illustrated as not limiting example in the annexed drawings, wherein.

DETAILED DESCRIPTION

Figure 1:
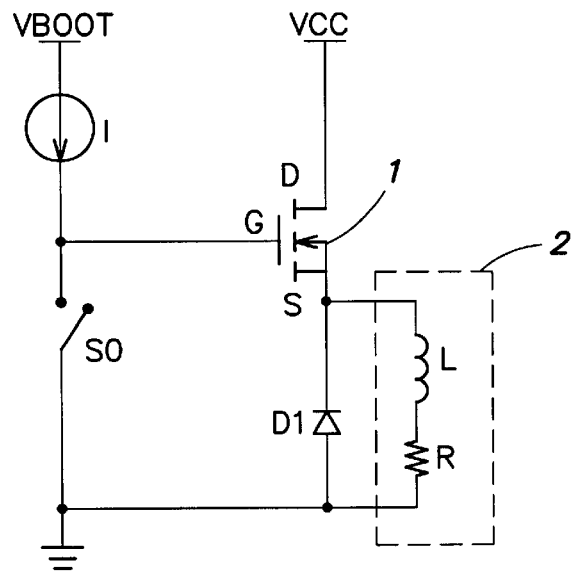
FIG. 1 is a schematic view of a high side circuit according to the prior art.

In FIG. 1, a high side circuit according to the prior art is shown wherein a DMOS transistor 1 is driven by a switch S0, which is formed for example by a DMOS or MOS transistor, and it allows the current flow into the inductive load 2 schematized by an inductance L and a resistance R in series. The inductance 1 is demagnetized through the diode D1 when the transistor 1 turns off.

Figure 2:
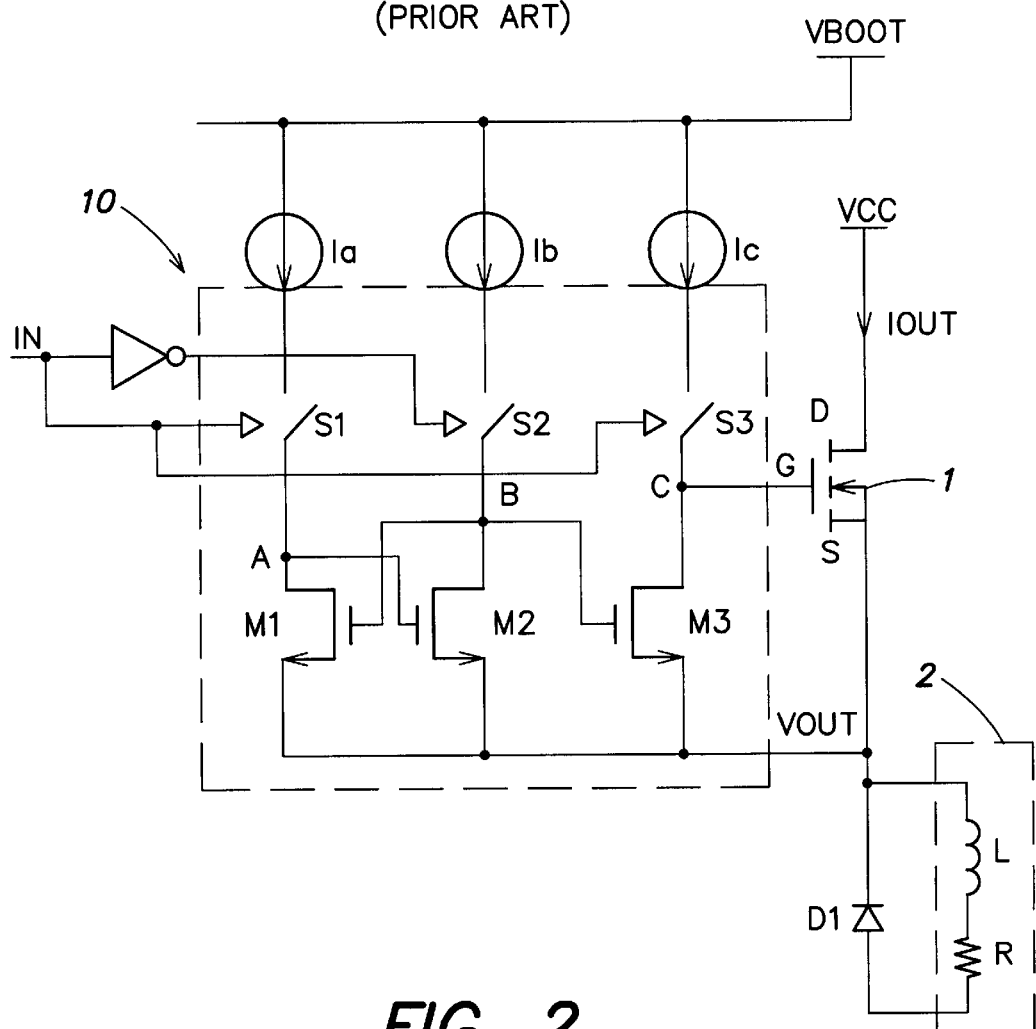
FIG. 2 shows a high side circuit according to present invention.

A high side circuit configuration according to present invention is shown in FIG. 2. In this case the driving of the DMOS transistor 1 is effected by a driving circuitry 10 comprising the NMOS transistors M1, M2, M3 which have respective source terminals connected to the source terminal S of the DMOS 1 and respective substrate terminals connected to the source terminals. The drain terminals of the transistors M1, M2, M3 are respectively connected to the switches S1, S2, S3, the switches S1 and S3 of which are driven by a signal IN while the switch S2 is driven by an inverted signal IN. The other terminals of the switches S1, S2, S3 can be connected to respective current generators Ia, Ib(=Ia), Ic connected in turn to the voltage Vboot. The gate terminals of the transistors M1 and M3 are connected to the drain terminal B of the transistor M2 while the gate terminal of the transistor M2 is connected to the drain terminal A of the transistor M1. The drain terminal of the transistor M3 is also connected to the gate terminal G of the transistor DMOS 1 which has the drain terminal D connected to the supply voltage Vcc and the source terminal S connected to the inductive load 2 and to the cathode of the diode D1 which are connected to ground. The output voltage Vout is the voltage at the source terminal S of the DMOS 1.

When the signal IN causes closure of the switches S1 and S3 and consequent opening of the switch S2, with the drain terminal B of the transistor M2 carried to a voltage Vout+Vdssat2 where the voltage Vdssat2 is the saturation voltage of the transistor M2, the transistors M1 and M3 are turned off while the transistor M2 is turned on because it has the gate terminal at the voltage Vboot. The gate terminal G of the transistor DMOS 1 is connected to the voltage Vboot and therefore it is turned on by making a current Iout to flow so that the output voltage Vout is Vout=Vcc−Rond*Iout wherein Rond is the turning on resistance of the DMOS 1.

When the signal IN causes the switch S2 to close and consequently the switches S1 and S3 to open, with the resistance Ron2 of the transistor M2 suitably dimensioned so that the product Ron2*Ia is higher than the threshold voltage Vth1 of the transistor M1, the transistor M1 is turned on. This causes the turning off of the transistor M2 so that the voltage at the terminal B is Vboot and the voltage at the terminal A is Vout+Vdssat1 where Vdssat1 is the saturation voltage of the transistor M1. Consequently the transistor M3 is turned on and allows the capacity of the gate G of the DMOS 1 to discharge into the inductive load 2. The voltage Vout successively will go to ground because there is the current re-cycle in the circuit formed by the diode D1 and the load 2. If the load 2 is inductive there is an under-ground re-cycle and the output voltage is Vout=−Vd where Vd is the voltage between the terminals of the diode D1. In this case the transistor DMOS cannot be re-turned on because the transistor M3 is turned on.

When the signal IN causes the switches S1 and S3 to close and consequently the switch S2 to open, with the resistance Ron1 of the transistor M1 in turning on state which is dimensioned so that the product Ron1*Ia is higher than the threshold voltage Vth2 of the transistor M2, the turning on cycle of the transistor DMOS 1 will be repeated.

Figure 3:
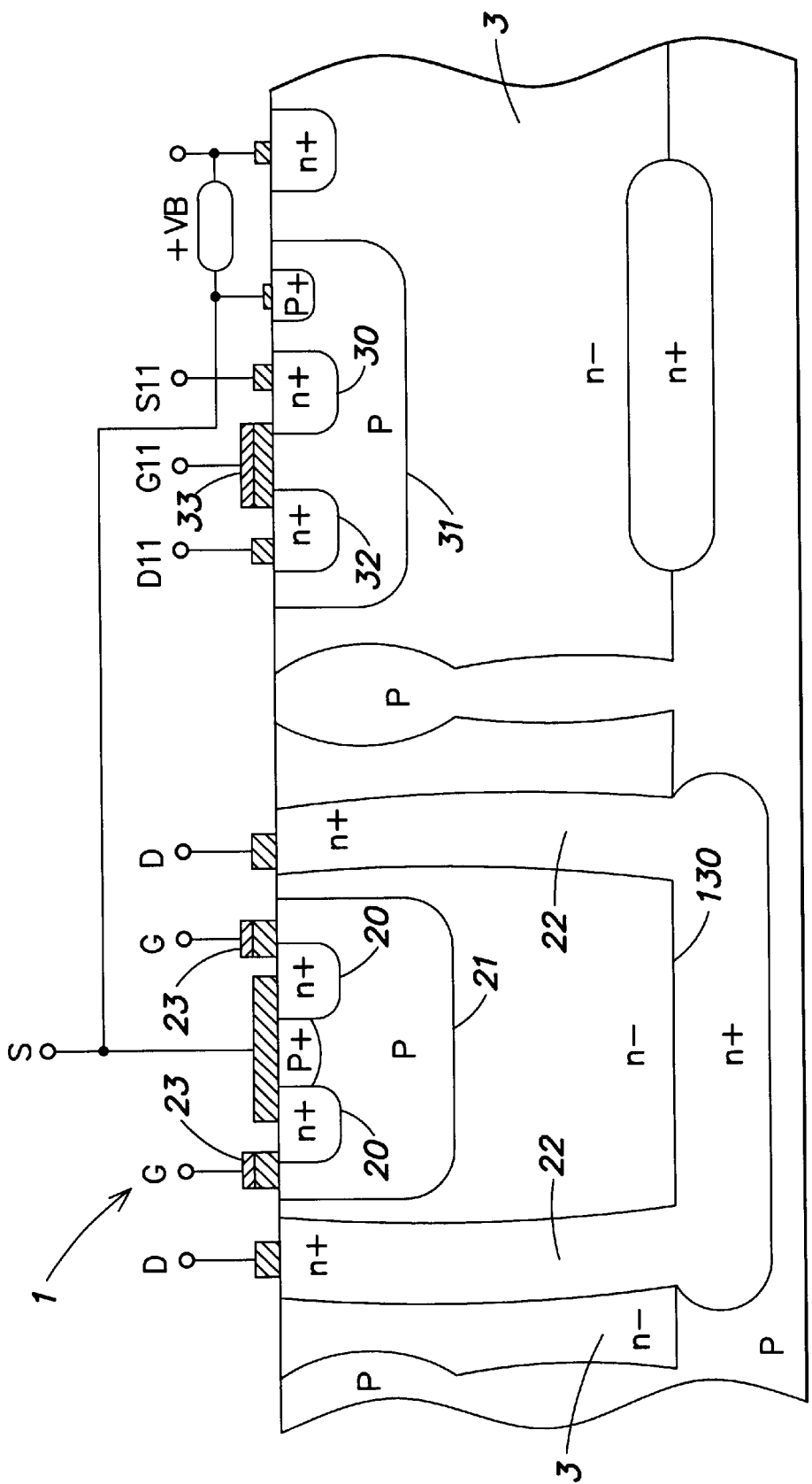
FIG. 3 is a cross-sectional schematic view of a part of an integrated device wherein there are a DMOS transistor and an NMOS transistor with an epitaxial layer connected to a voltage VB.

Traditionally the aforementioned NMOS and DMOS transistors are implemented by present lithography technologies on respective dopant low concentration N-type respective layers 3 and 130, as shown in FIG. 3. In FIG. 3, a section of a device is shown schematically which is integrated with the transistor DMOS 1, which is, for example, a vertical DMOS transistor having the source region 20 and the bulk region 21 in contact with each other through only one source terminal S and the drain regions 22 in contact with the drain terminals D and the gate 23 in contact with the gate terminals G, and only one NMOS transistor having the source region 30 and the bulk region 31 in contact with each other through only one source terminal S11, the drain region 32 in contact with the drain terminal D11 and the gate 33 in contact with the gate terminal G11. Preferably the epitaxial layer 3 is biased to a voltage VB which is always higher than zero but it follows always the output voltage Vout, which is the output voltage of the DMOS transistor 1 and it is even the voltage at the sources of the transistor M1, M2, M3. The epitaxial layer 3 must withstand the whole voltage Vboot with respect to the substrate.

Figure 4:
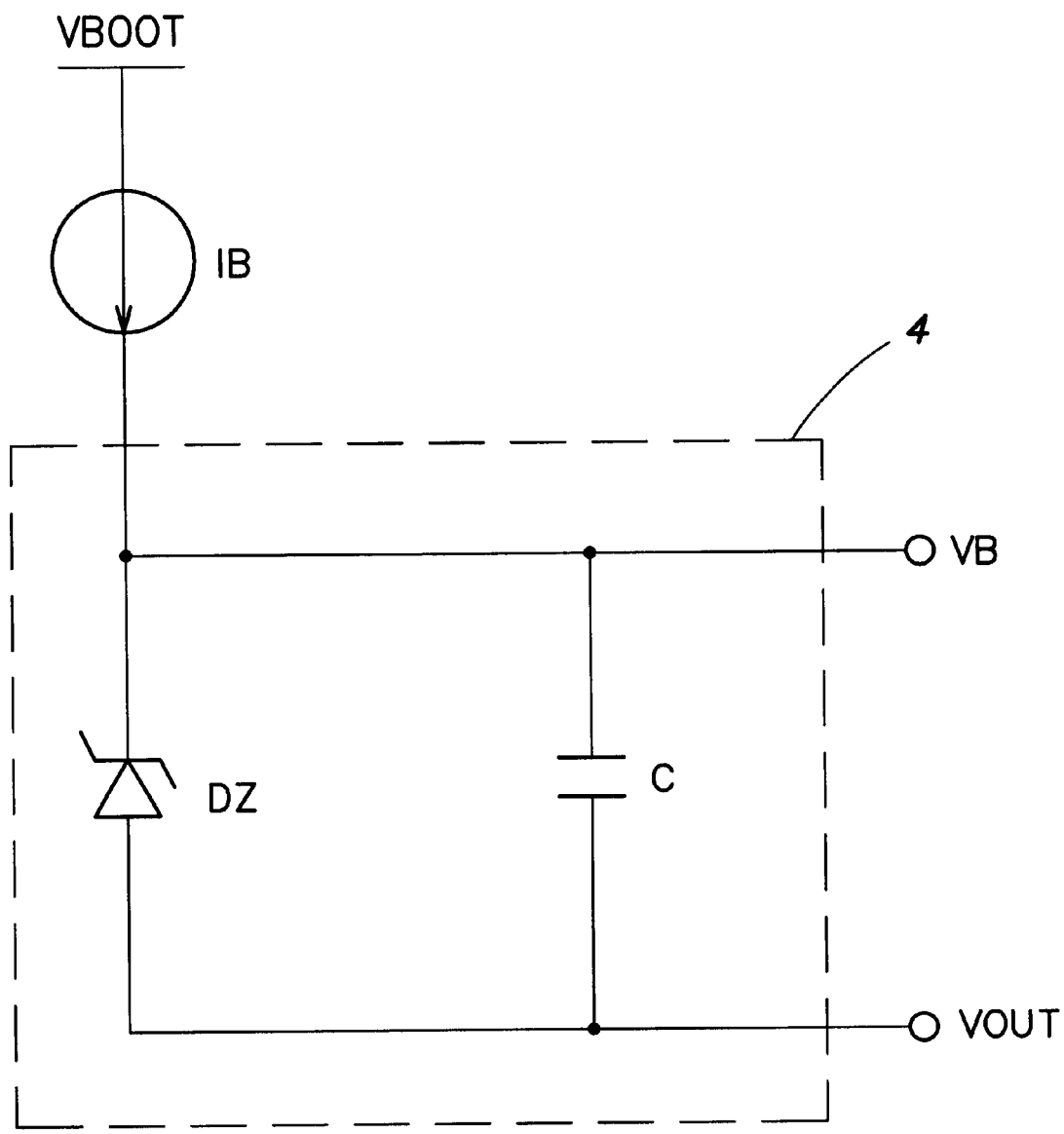
FIG. 4 shows a circuit utilizable for generating the biasing voltage VB.

A simple circuit which generates the voltage VB is shown in FIG. 4; a block 4, constituted by a zener diode Dz disposed in parallel with a capacitor C, is displaced between the terminals of the output voltage Vout and the voltage VB. The terminal of the voltage VB is in turn connected to a current generator IB connected to the voltage Vboot. The capacitor C must maintain the well potential VB in the case of fast transitions.

It is possible to use clamp diodes disposed among the node A, B, and the terminal G and the voltage Vout in the case of fast commutation transitions of the NMOS transistors M1, M2, M3 to avoid damaging them.

Also, the currents Ia, Ib, Ic can be generated to be independent from the temperature variations for reducing the variations of the commutation times with respect to the process parameters.

The currents Ia, Ib, Ic can be even timed to have a high value during the commutation transitions of the transistors and a low value in the static states.

With the high side circuit configuration according to the present invention, the high side circuit efficiency is improved or optimized. In fact the new driving circuitry of the DMOS transistor 1 allows both the circuit to operate in under-ground state for avoiding the re-turn on of the DMOS 1 to avoid dangerous current peaks, and the gate capacitance of the DMOS transistor to be discharged into the load to increase the high side efficiency.

Also, if the biasing voltage VB is utilized for the epitaxial well which contains the NMOS transistors M1, M2, M3, such transistors can be NMOS transistors for low voltages and therefore they must have smaller dimensions. If the voltage VB is higher than zero during the current recycle when the DMOS transistor is turned off and the diode D1 is integrated, the power transistor is immune to the parasitic components of the driving circuitry.

The aforementioned circuit allows a different driving method of the DMOS power transistor 1.

A method for driving the DMOS power transistor 1 in a high side circuit configuration. The power transistor 1 has the drain terminal connected to the supply voltage Vcc and a load 2 connected between the source terminal S of the DMOS power transistor 1 and ground. The method includes driving the power transistor 1 by a turning on step and a turning off step of the power transistor 1. The driving provides that during the turning off state of the power transistor 1 the re-turning on thereof is avoided by reducing or minimization of the potential difference between the source terminal S and the gate terminal G of the power transistor 1 by the driving circuitry 10 described above and formed by the NMOS transistors M1, M2, M3. Also such driving circuitry 10 allows that during this turning off step the discharge of the capacitance associated with gate terminal G towards the load 2 is controlled. The driving circuitry 10 operates according to the previously described operation.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A high side circuit comprising:
  at least one power device having a first non-drivable terminal connected to a supply voltage;
  at least one load connected between a second non-drivable terminal of the at least one power device and ground; and
  driving circuitry comprising transistors which are connected to each other and to a higher voltage than said supply voltage to control said at least one power device and to reduce a potential difference between the second non-drivable terminal and a drivable terminal of the at least one power device during a transition from an on state to an off state of the at least one power device so as to prevent the at least one power device from inadvertently returning to the on state from the off state;

wherein the transistors belonging to the driving circuitry include at least three transistors;

wherein the transistors belonging to the driving circuitry include at least a first MOS transistor and a second MOS transistor; and each of the first MOS transistor and the second MOS transistor is dimensioned so that a product of an on-state resistance of the transistor and a current flowing through the transistor is higher than a threshold voltage of the other transistor.

2. The high side circuit according to claim 1, wherein the driving circuitry is configured to discharge a capacitance associated with the drivable terminal of the at least one power device into the at least one load during the transition from the on state to the off state of said at least one power device.

3. The high side circuit according to claim 1, wherein the at least one power device includes at least one MOS power transistor.

4. The high side circuit according to claim 3, wherein the first non-drivable terminal is a drain terminal of the MOS power transistor, the second non-drivable terminal is a source terminal of the MOS power transistor and the drivable terminal is a gate terminal of the MOS power transistor.

5. The high side circuit according to claim 1, wherein the transistors belonging to the driving circuitry are MOS transistors.

6. The high side circuit according to claim 5, wherein the MOS transistors belonging to the driving circuitry are N-channel MOS transistors.

7. The high side circuit according to claim 3, wherein the at least one MOS power transistor includes at least one NMOS power transistor.

8. The high side circuit according to claim 7, wherein the at least one NMOS power transistor includes at least one DMOS transistor.

9. The high side circuit according to claim 1, wherein the transistors belonging to the driving circuitry have first non-drivable terminals connected to the second non-drivable terminal of the at least one power device and second non-drivable terminals connected to switches which are driven by a signal and are connected to the higher voltage than the supply voltage.

10. The high side circuit according to claim 1, wherein:
the at least one power device includes at least one MOS power transistor;
the transistors belonging to the driving circuitry include a third transistor;
a drain terminal of the third transistor is connected to a gate terminal of the at least one MOS power transistor and a source terminal of the third transistor is connected to a source terminal of the at least one MOS power transistor; and
the third transistor discharges a charge accumulated by the gate of the at least one MOS power transistor into the at least one load during the transition from the on state to the off state of the at least one MOS power transistor.

11. A high side circuit comprising:
at least one power device having a first non-drivable terminal connected to a supply voltage;
at least one load connected between a second non-drivable terminal of the at least one power device and ground; and driving circuitry comprising transistors which are connected to each other and to a higher voltage than said supply voltage to control said at least one power device and to reduce a potential difference between the second non-drivable terminal and a drivable terminal of the at least one power device during a transition from an on state to an off state of the at least one power device so as to prevent the at least one power device from inadvertently returning to the on state from the off state;

wherein the circuit is formed as an integrated device comprising an epitaxial layer, wherein the epitaxial layer is connected to a biasing voltage which follows a voltage at the second non-drivable terminal of the at least one power device.

12. The high side circuit according to claim 11, wherein the biasing voltage of the epitaxial layer is higher than zero.

13. A method for driving at least one power device in a high side circuit configuration, the at least one power device having a first non-drivable terminal connected to a supply voltage, the high side circuit configuration further comprising at least one load connected between a second non-drivable terminal of the at least one power device and ground, the method comprising an act of:

(A) reducing a potential difference between the second non-drivable terminal and a drivable terminal of the at least one power device during a transition from an on state to an off state of the at least one power device so as to prevent the at least one power device from inadvertently returning to the on state from the off state;

wherein the act (A) includes an act of:

(B) driving the at least one power device by a driving circuitry comprising transistors which are connected to each other and to a higher voltage than a supply voltage;

wherein the transistors belonging to the driving circuitry include at least three transistors, and wherein the act (B) includes and act of:

driving the at least one power device by a driving circuitry comprising at least three transistors which are connected to each other and to a higher voltage than a supply voltage; and wherein the transistors belonging to the driving circuitry are MOS transistors and the first and the second of the at least three MOS transistors are dimensioned so that the respective products of their turning on resistances and the respective currents flowing therein are higher than the threshold voltages of the second and first transistor respectively and wherein the act (C) includes an act of (D) driving the at least one power device by a driving circuitry comprising at least three transistors which are connected to each other and to a higher voltage than a supply voltage and where the first and the second of the at least three MOS transistors are dimensioned so that the respective products of their turning on resistances and the respective currents flowing therein are higher than the threshold voltages of the second and first transistor respectively.

14. The method according to claim 13, wherein the act (A) includes an act of:
causing a capacitive charge associated with the drivable terminal of the at least one power device to discharge into the at least one load during the transition from the off state to the on state.

15. The method according to claim 13, wherein the at least one power device includes at least one MOS power transistor, and wherein the act (A) includes an act of:

(B) reducing the potential difference between the second non-drivable terminal and the drivable terminal of the at least one MOS power transistor during the transition from the on state to the off state of the at least one MOS power transistor so as to prevent the at least one MOS power transistor from inadvertently returning to the on state from the off state.

16. The method according to claim 15, wherein the first non-drivable terminal is the drain terminal of the at least one MOS power transistor, the second non-drivable terminal is the source terminal of the at least one MOS power transistor, the drivable terminal is the gate terminal of the at least one MOS power transistor, and wherein the act (B) includes an act of:

reducing the potential difference between the source terminal and the gate terminal of the at least one MOS power transistor during the transition from the on state to the off state of the at least one MOS power transistor so as to prevent the at least one MOS power transistor from inadvertently returning to the on state from the off state.

17. The method according to claim 13, wherein the transistors belonging to the driving circuitry are MOS transistors and wherein the act (B) includes an act of:

(C) driving the at least one power device by the driving circuitry comprising the MOS transistors which are connected to each other and to the higher voltage than the supply voltage.

18. The method according to claim 17, wherein the MOS transistors belonging to the driving circuitry are N-channel MOS transistors and wherein the act (C) includes an act of:

driving the at least one power device by the driving circuitry comprising the N-channel MOS transistors which are connected to each other and to the higher voltage than the supply voltage.

19. The method according to claim 15, wherein the at least one MOS power transistor is at least one NMOS power transistor and wherein the act (B) includes an act of:

(C) reducing the potential difference between the second non-drivable terminal and the drivable terminal of the at least one NMOS power transistor during the transition from the on state to the off state of the at least one NMOS power transistor so as to prevent the at least one NMOS power transistor from inadvertently returning to the on state from the off state.

20. The method according to claim 19, wherein the at least one NMOS power transistor is at least one DMOS transistor and wherein the act (C) includes an act of:

reducing the potential difference between the second non-drivable terminal and the drivable terminal of the at least one DMOS power transistor during the transition from the on state to the off state of the at least one DMOS power transistor so as to prevent the at least one DMOS power transistor from inadvertently returning to the on state from the off state.

21. The method according to claim 13, wherein the at least one power device is driven by transistors belonging to the driving circuitry having first non-drivable terminals connected to the second non-drivable terminal of the at least one power device and second non-drivable terminals connected to switches which are connected to the higher voltage than the supply voltage and wherein the act (B) includes an act of:

driving the switches by an outside signal.

22. The method according to claim 13, wherein the at least one power device includes at least one MOS power transistor, and wherein the act (D) includes an act of:

discharging a charge accumulated by a gate of the at least one MOS power transistor into the at least one load during the transition from the on state to the off state of the at least one MOS power transistor.

* * * * *